United States Patent
La et al.

(10) Patent No.: US 6,868,034 B2
(45) Date of Patent: Mar. 15, 2005

(54) CIRCUITS AND METHODS FOR CHANGING PAGE LENGTH IN A SEMICONDUCTOR MEMORY DEVICE

(75) Inventors: One-Gyun La, Kyungki-do (KR); Yun-Sang Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 10/639,858

(22) Filed: Aug. 13, 2003

(65) Prior Publication Data

US 2004/0095835 A1 May 20, 2004

(30) Foreign Application Priority Data

Nov. 19, 2002 (KR) .................................. 10-2002-0072093

(51) Int. Cl.$^7$ ................................................ G11C 8/00
(52) U.S. Cl. ................................ 365/238.5; 365/230.06
(58) Field of Search ........................ 365/238.5, 230.03, 365/230.06

(56) References Cited

U.S. PATENT DOCUMENTS

| | | | | |
|---|---|---|---|---|
| 6,108,243 A | | 8/2000 | Suzuki et al. ........... | 365/189.01 |
| 6,181,633 B1 | | 1/2001 | Shimakawa et al. ... | 365/260.03 |
| 6,496,442 B2 | * | 12/2002 | Koyanagi et al. ....... | 365/230.03 |
| 6,694,422 B1 | * | 2/2004 | Kim ...................... | 365/230.03 |
| 6,700,831 B2 | * | 3/2004 | Feurle .................... | 365/230.03 |

* cited by examiner

*Primary Examiner*—Tan T. Nguyen
(74) *Attorney, Agent, or Firm*—F. Chau & Associates LLC; Frank V. DeRosa

(57) ABSTRACT

A semiconductor memory device having an architecture that allows a user to change a page length of the semiconductor device. Circuits and methods for changing a page length of a semiconductor device enable selective activation of one or more corresponding wordlines (having the same row address) of memory cell array blocks of a memory cell array to thereby change the page length according to a specified operational mode.

29 Claims, 10 Drawing Sheets

FIG. 4A

| CBA0 | CBA1 | ACTIVATED SUB MEMORY CELL ARRAY BLOCKS | PAGE LENGTH OF SEMICONDUCTOR MEMORY DEVICE |
|---|---|---|---|
| LOW | LOW | SUB MEMORY CELL ARRAY BLOCK 0 | $2^{n-2}$ (n IS THE NUMBER OF ADDRESSES) |
| HIGH | LOW | SUB MEMORY CELL ARRAY BLOCK 1 | |
| LOW | HIGH | SUB MEMORY CELL ARRAY BLOCK 2 | |
| HIGH | HIGH | SUB MEMORY CELL ARRAY BLOCK 3 | |

FIG. 4B

| CBA0 | CBA1 | ACTIVATED SUB MEMORY CELL ARRAY BLOCKS | PAGE LENGTH OF SEMICONDUCTOR MEMORY DEVICE |
|---|---|---|---|
| LOW | LOW | SUB MEMORY CELL ARRAY BLOCK 0, SUB MEMORY CELL ARRAY BLOCK 1 | $2^{n-1}$ (n IS THE NUMBER OF ADDRESSES) |
| HIGH | LOW | | |
| LOW | HIGH | SUB MEMORY CELL ARRAY BLOCK 2, SUB MEMORY CELL ARRAY BLOCK 3 | |
| HIGH | HIGH | | |

| CBA0 | CBA1 | ACTIVATED SUB MEMORY CELL ARRAY BLOCKS | PAGE LENGTH OF SEMICONDUCTOR MEMORY DEVICE |
|---|---|---|---|
| LOW | LOW | SUB MEMORY CELL ARRAY BLOCK 0, SUB MEMORY CELL ARRAY BLOCK 1, SUB MEMORY CELL ARRAY BLOCK 2, SUB MEMORY CELL ARRAY BLOCK 3 | $2^n$ (n IS THE NUMBER OF ADDRESSES) |
| HIGH | LOW | | |
| LOW | HIGH | | |
| HIGH | HIGH | | |

CIRCUITS AND METHODS FOR CHANGING PAGE LENGTH IN A SEMICONDUCTOR MEMORY DEVICE

CROSS-REFERENCE TO RELATED APPLICATION

This application claims priority to Korean Patent Application No. 2002-72093, filed on Nov. 19, 2002, in the Korean Intellectual Property Office.

TECHNICAL FIELD OF THE INVENTION

The present invention is directed to a semiconductor memory device having an architecture that allows a user to change a page length of the semiconductor device. In addition, the present invention is directed to circuits and methods for changing a page length of a semiconductor device, wherein addressing schemes and control circuitry enable selective activation of one or more corresponding wordlines (having a same row address) of memory array cell blocks of a memory cell array to thereby change the page length according to a specified operational mode.

BACKGROUND

Currently, semiconductor memory devices provide various operational modes with wide applications. For example, synchronous semiconductor memory devices (such as a SDRAM (synchronous dynamic random access memory)) can support variable column address strobe latency (CL) and burst length (BL) modes using a mode register set (MRS). These semiconductor memory devices are used in various devices and applications such as electronic equipment, network systems, communication systems, control systems, multimedia applications, and main memories of PCs (personal computers).

FIGS. 1A through 1C illustrate a hierarchical memory architecture of a semiconductor memory device according to the prior art. As shown in FIG. 1A, a semiconductor memory device (100) includes a plurality of memory banks (100A, 100B, 100C, 100D). Each memory bank represents, for example, a logical unit of memory in a PC, and each bank may consist of one or more memory modules (e.g., DIMM (Dual Inline Memory Module), SIMM (Single In-Line Memory Module)). Each memory bank (100A, 100B, 100C, 100D) is further logically divided into a plurality of memory cell array blocks. For instance, as depicted in the exemplary embodiment of FIG. 1B, the memory bank (100A) comprises four memory cell array blocks (100a, 100b, 100c, 100d).

In addition, each memory cell array block (100a, 100b, 100c, 100d) is further logically divided into a plurality of sub-memory cell array blocks, wherein each sub-memory array block is controlled by associated control circuitry. For instance, as depicted in the exemplary embodiment of FIG. 1C, the memory cell array block (100a) comprises four sub-memory cell array blocks (110, 120, 130, 140). The memory cell array block (100a) further comprises a plurality of word line drivers (111, 121, 131, 141), wherein each word line driver is associated with one of the sub-memory cell array blocks (110, 120, 130, 140), as well as a plurality of sub-decoders (112, 122, 132, 142) and a row decoder (150).

The memory framework depicted in FIGS. 1A–C is typically implemented in a partial activation semiconductor memory device, for example a fast cycle dynamic random access memory (FCRAM), whereby one of the sub-memory cell array blocks (110, 120, 130, 140) can be activated using, for example, column block addresses (CBAs) to perform data access or refresh operations.

By way of example, to perform a memory access operation, one of the memory banks (100A, 100B, 100C, 100D) is initially selected in response to a predetermined bank address, and then a memory cell array block (100a, 100b, 100c, 100d) within the selected memory bank is selected in response to a predetermined address (e.g., row address). Then, one sub-memory cell array block (in the selected memory cell array block) is selected in response to, e.g., a column block address (CBA). For instance, in the exemplary embodiment of FIG. 1C, since the memory cell array block (100a) comprises four sub-memory blocks (110, 120, 130, 140), two column block addresses (CBAs) are used to select one of the sub-memory blocks.

More specifically, during a write or read operation (memory access), a row address RAi (i=2, 3, . . . ,n) is input to the row decoder (150) and decoded. Then, based on the result of the decoding, the row decoder (150) will activate one of a plurality of normal word line enable signals (NWE) corresponding to the input row address RAi. In response to another row address RAi (i=0,1) and CBAs, one of the sub-decoders (112, 122, 132, 142) will generate a word line power supply signal having a predetermined boosting level, and output the word line power supply signal to a corresponding one of the wordline drivers (111, 121, 131, 141). In response to the wordline power supply signal and the wordline enable signal NEW, the wordline activates a corresponding one of the word lines (WL_0, WL_1, WL_2, WL_3) through a predetermined switching circuit (not shown). Once the word line is activated for the selected sub-memory cell array block, a column address is input and decoded to read or write data to the selected sub-memory block.

In a DRAM having the memory framework as depicted in FIGS. 1A–1C, since only one of the sub-memory cell array blocks (110, 120, 140, 140) can be activated at any given time, the page length of the semiconductor device is fixed. As is known in the art, a "page" refers to the number of bits that can be accessed from one row address, and the number of column addresses determines the size of the "page". For instance, in the memory cell array block (100a) of FIG. 1C, assuming the total number of external input addresses is n, the total number of column addresses used to select a column select line (CSL) of each sub-memory cell array block is n−2. This is because two column addresses are used to select one of the four sub-memory cell array blocks (100a, 100b, 100c, 100d). Thus, a page length corresponding to an activated word line of a selected sub-memory cell array block is fixed at $2^{n-2}$. Accordingly, a conventional semiconductor memory device having a framework such as shown in FIG. 1C that provides a fixed page length of $2^{n-2}$ is not compatible with a semiconductor memory device (for example, SDRAM) having page length of $2^n$ or $2^{n-1}$, for example.

Thus, a semiconductor memory device having an architecture that would enable the page length to be adjusted for a given application would be highly advantageous.

SUMMARY OF THE INVENTION

The present invention is directed to a semiconductor memory device having an architecture that allows a user to change a page length of the semiconductor device. In addition, preferred embodiments of the present invention include circuits and methods for changing a page length of a semiconductor device, wherein addressing schemes and control circuitry enable selective activation of one or more corresponding wordlines (having the same row address) of memory cell array blocks of a memory cell array to thereby change the page length according to a specified operational mode.

Advantageously, by allowing the page length to be changed, the present invention enables compatibility between semiconductor devices having different page lengths.

A semiconductor device according to one embodiment of the invention comprises a memory cell array that is logically divided into a plurality of memory blocks, wherein each memory block is addressable by a corresponding block address, a plurality of wordline control circuits, wherein each wordline control circuit is associated with one of the memory blocks for activating a wordline of the associated memory block, and a control circuit for selectively controlling the wordline control circuits to activate one or more corresponding wordlines having a same row address to change a page length of the semiconductor memory device.

Preferably, the control circuit receives as input a block address (e.g., a column block address) and a first control signal, and then generates a second control signal to selectively activate one or more of the wordline control circuits. In one embodiment, the first control signal is dynamically generated using a mode register set, in response to a predetermined command and an external address. In other embodiments, the first control signal is fixed by programming a control signal generator using wire bonding, metal bonding or fuse cutting.

In another embodiment of the invention, a memory system comprises a first memory device comprising a memory cell array that is logically divided into a plurality of memory blocks, wherein each memory block is addressable by a corresponding block address, a plurality of wordline control circuits, wherein each wordline control circuit is associated with one of the memory blocks for activating a wordline of the associated memory block, and a control circuit for selectively controlling the wordline control circuits to activate one or more corresponding wordlines having a same row address to change a page length of the semiconductor memory device.

In yet another embodiment of the invention, a method is provided for changing a page length of a semiconductor memory device comprising a memory cell array that is logically divided into a plurality of memory blocks, wherein each memory block is addressable by a corresponding block address. The method comprises generating a first control signal specifying one of a plurality of page length operational modes and generating a second control signal based on the first control signal and a block address. In response to the second control signal, one or more wordlines in the memory blocks having a same row address are selectively activated to provide a page length of the semiconductor memory device corresponding to the specified page length operational mode.

These and other embodiments, aspects, features and advantages of the present invention will be described and become apparent from the following detailed description of preferred embodiments, which is to be read in connection with the accompanying drawings.

BRIEF DESCRIPTION OF THE DRAWINGS

FIGS. 4A, 4B and 4C are table diagrams illustrating various operational modes of the memory cell array block FIG. 3 in which different page lengths are obtained for a semiconductor memory device.

FIG. 5 is a circuit diagram illustrating a sub-decoder according to an embodiment of the invention, which can be implemented in the circuit of FIG. 3.

DETAILED DESCRIPTION OF PREFERRED EMBODIMENTS

The present invention is directed to a semiconductor memory device having an architecture that allows a user to change a page length of the semiconductor device. More specifically, circuits and methods according to preferred embodiments of the present invention are based on addressing schemes and control circuitry which enable selective activation of one or more corresponding wordlines (having a same address) of sub-memory cell blocks of a memory cell block to change the page length of a semiconductor memory device according to a specified operational mode.

Figure 1A:
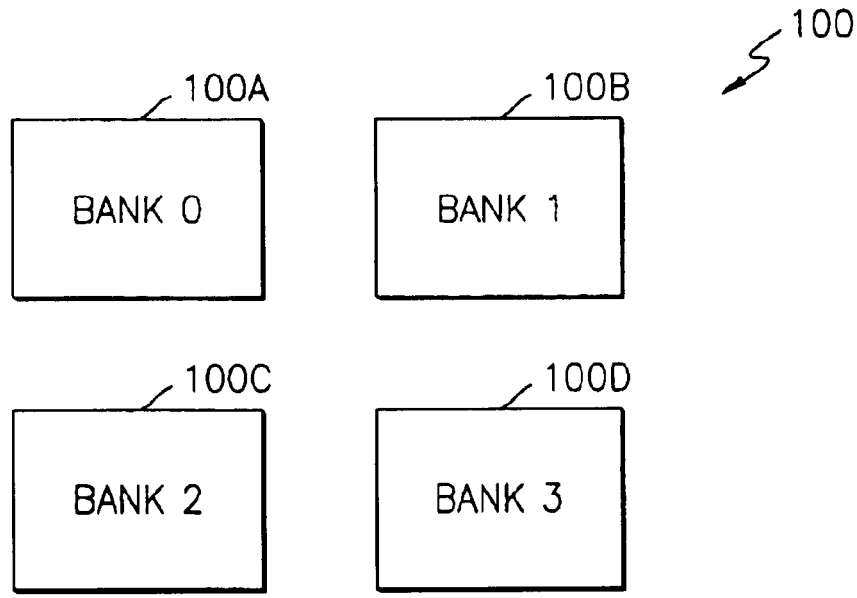
FIGS. 1A, 1B and 1C are schematic diagrams that illustrate a hierarchical memory architecture of a semiconductor memory device according to the prior art.
Figure 1B:
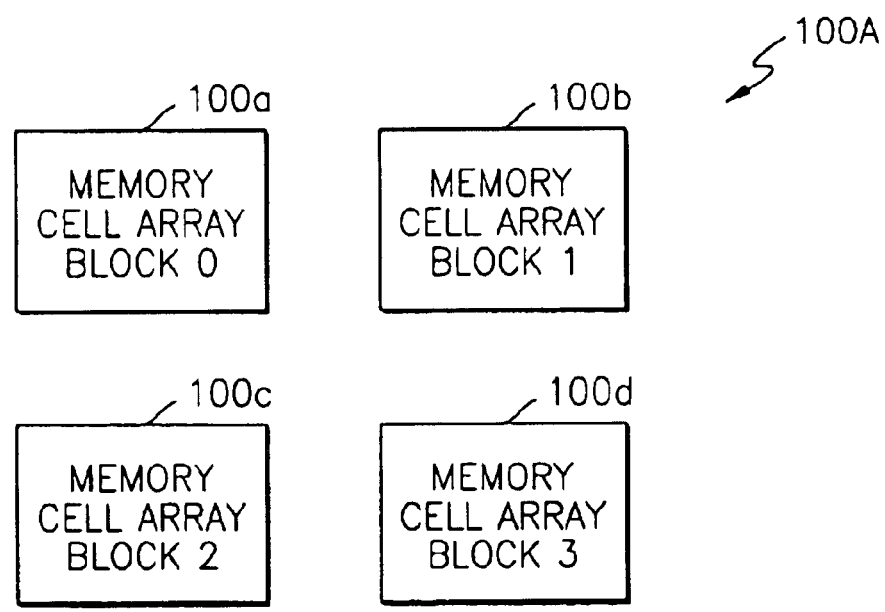
Figure 1C:
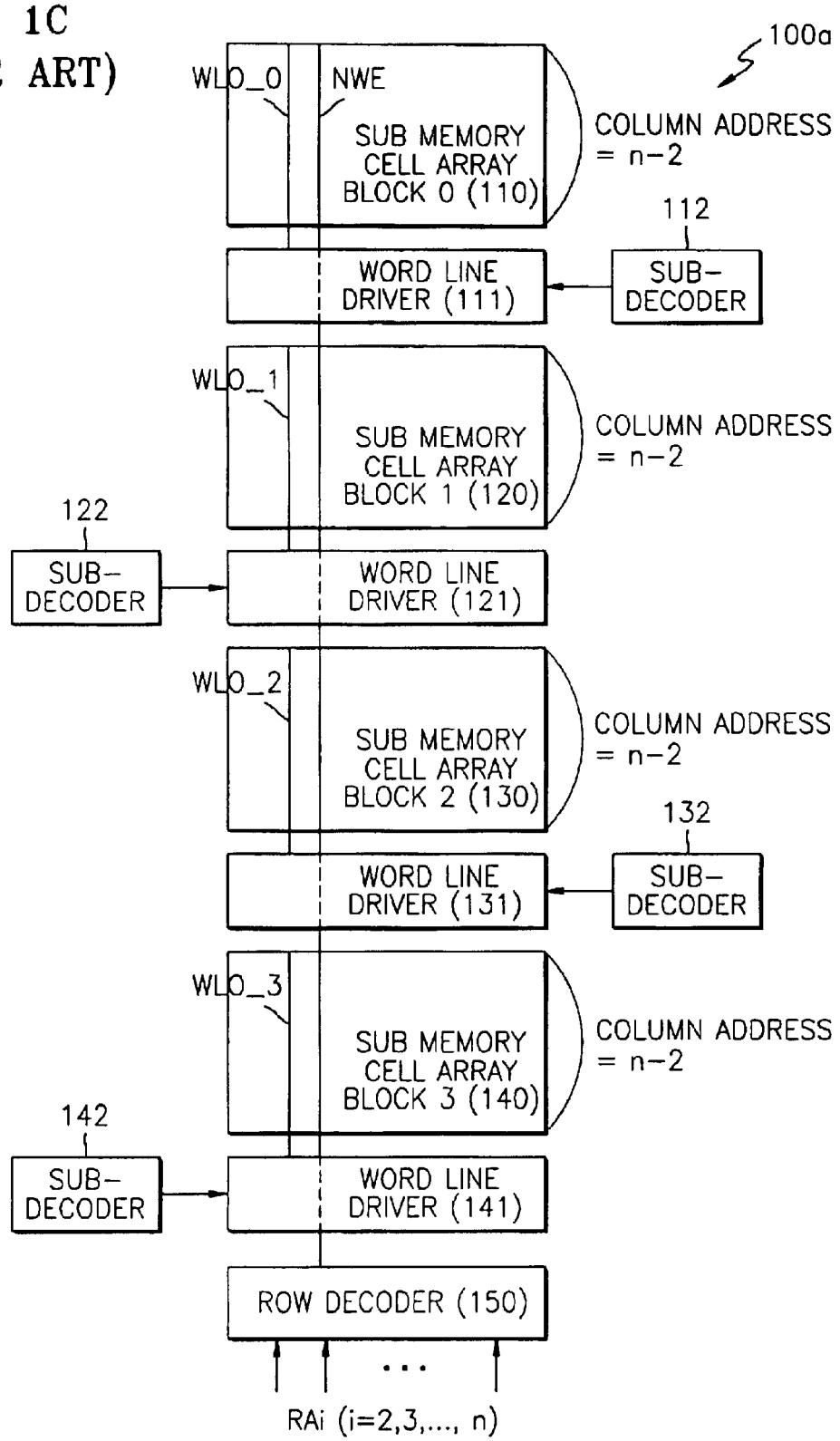
Figure 2:
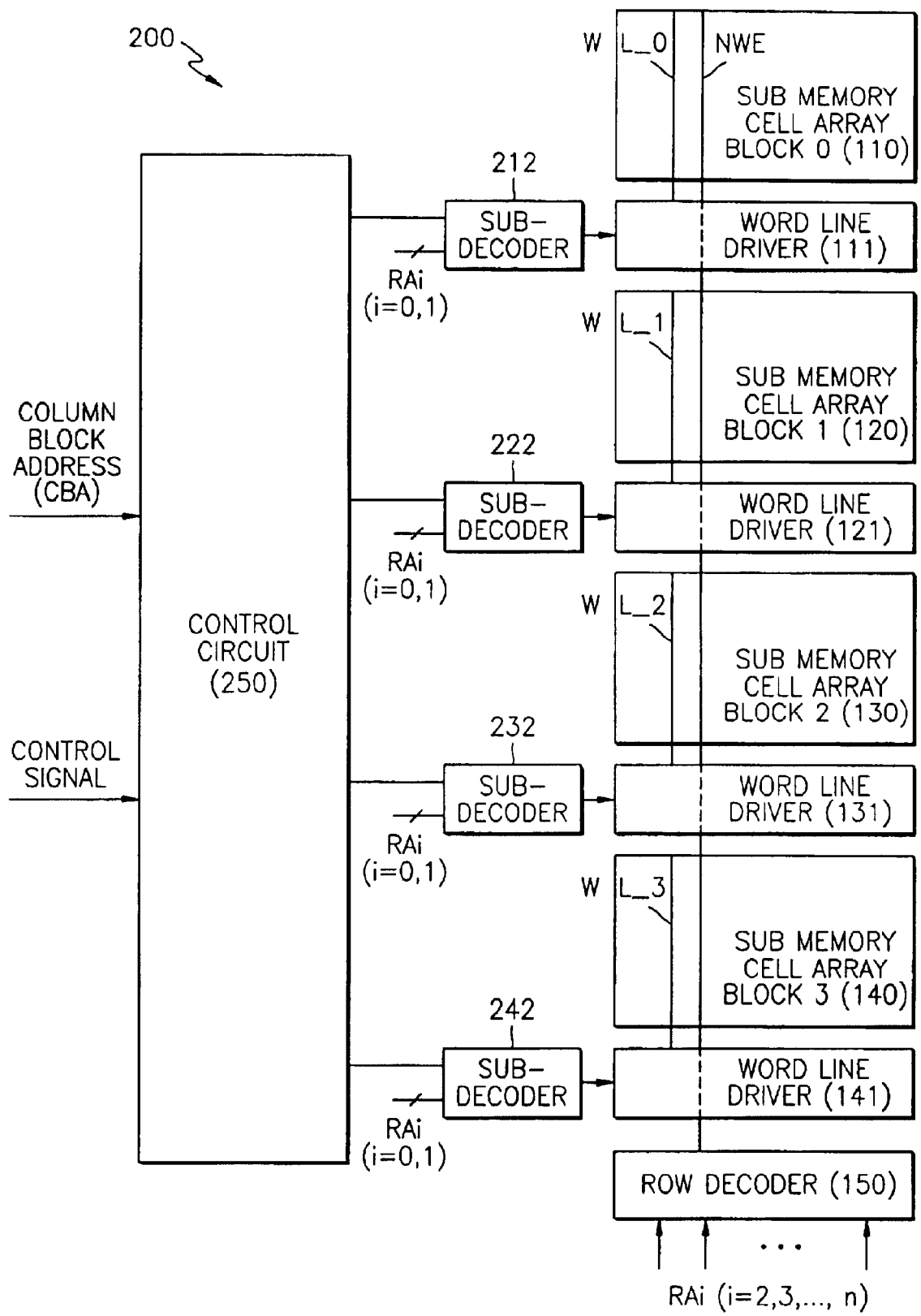
FIG. 2 is a schematic diagram of a memory cell array block framework according to an embodiment of the present invention, which enables a page length of a semiconductor memory device to be changed.

FIG. 2 is a high-level schematic diagram of a memory cell array block architecture according to an embodiment of the present invention, which enables a page length of a semiconductor memory device to be changed. The exemplary embodiment of FIG. 2 can be viewed as an extension of the memory framework depicted in FIG. 1C, wherein control and addressing mechanisms allow the page length to be changed (as opposed to the FIG. 1C framework which has a fixed page length). Referring to FIG. 2, a semiconductor memory device comprises a memory cell array block (200) (or "memory block") having a memory array that is logically divided into a plurality of sub-memory cell array blocks (110, 120, 130, 140) (or "sub-memory block"), wherein each sub-memory block is addressable by a corresponding block address (e.g., CBA (column block address)). In the exemplary embodiment, 4 sub-memory blocks (blocks 0, 1, 2 and 3) are shown for illustrative purposes, although it is to be understood that the memory block (200) may comprise more or less sub-memory blocks.

The memory block (200) further comprises a plurality of word line drivers (111, 121, 131, 141), wherein each word line driver (111, 121, 131, 141) is associated with one of the plurality of sub-memory blocks (110, 120, 130, and 140), and a plurality of sub-decoders (212, 222, 232, 242), wherein each sub-decoder (212, 222, 232, 242) is associated with one of the word line drivers (111, 121, 131, 141). Each corresponding subdecoder/word line driver pair comprises a wordline control circuit that is used for activating a wordline of an associated sub-memory block.

In general, a control circuit (250) selectively controls the wordline control circuits to selectively activate one or more corresponding wordlines (WL_0, WL_1, WL_2, WL_3) of the sub-memory blocks (110, 120, 130, 140) having the same row address as decoded by row decoder (150), to thereby change a page length of the semiconductor memory device. More specifically, the row decoder (150) receives and decodes a second input row address RAi (where, i=2, 3, . . . , n), and activates a normal word line enable signal (NWE) corresponding to the input row address, based on the decoding results. The control circuit (250) receives as input a column block address (CBA) and a control signal, and in response, outputs corresponding control signals to the sub-decoders (212, 222, 232, 242). The sub-decoders (212, 222, 232, 242) receive as input controls signals from the control circuit (250) and a first row address RAi (where, i=0 and 1), and then generate control signals that are output to the word line drivers (111, 121, 131, 141).

Based on the control signals from the sub-decoders (212, 222, 232, 242) and the NWE signal from the row decoder (150), the wordline drivers (111, 121, 131, 141) will selectively activate one or more corresponding wordlines (WL_0, WL_1, WL_2, WL_3) of the sub-memory blocks (110, 120, 130, 140), which have the same row address, to change the page length of the semiconductor memory device. For instance, in the exemplary embodiment of FIG. 2, assuming the number of column address for each sub-memory block is n−2, then either (i) a wordline of one of the sub-memory blocks can be activated to obtain a page length of $2^{n-2}$, (ii) corresponding wordlines of two sub-memory blocks can be activated to obtain a page length of $2^{n-1}$, or (iii) corresponding wordlines of all four sub-memory blocks can be activated to obtain a page length of $2^n$.

Thus, in the exemplary embodiment of FIG. 2, one or more word line drivers (111, 121, 131, 141) can be selectively driven by the control circuit (250) based on the combination of the control signal and the CBA input to the control circuit (250). Accordingly, the number of activated wordlines having the same row address can be adjusted, thereby changing the page length of the semiconductor memory device as desired.

Figure 3:
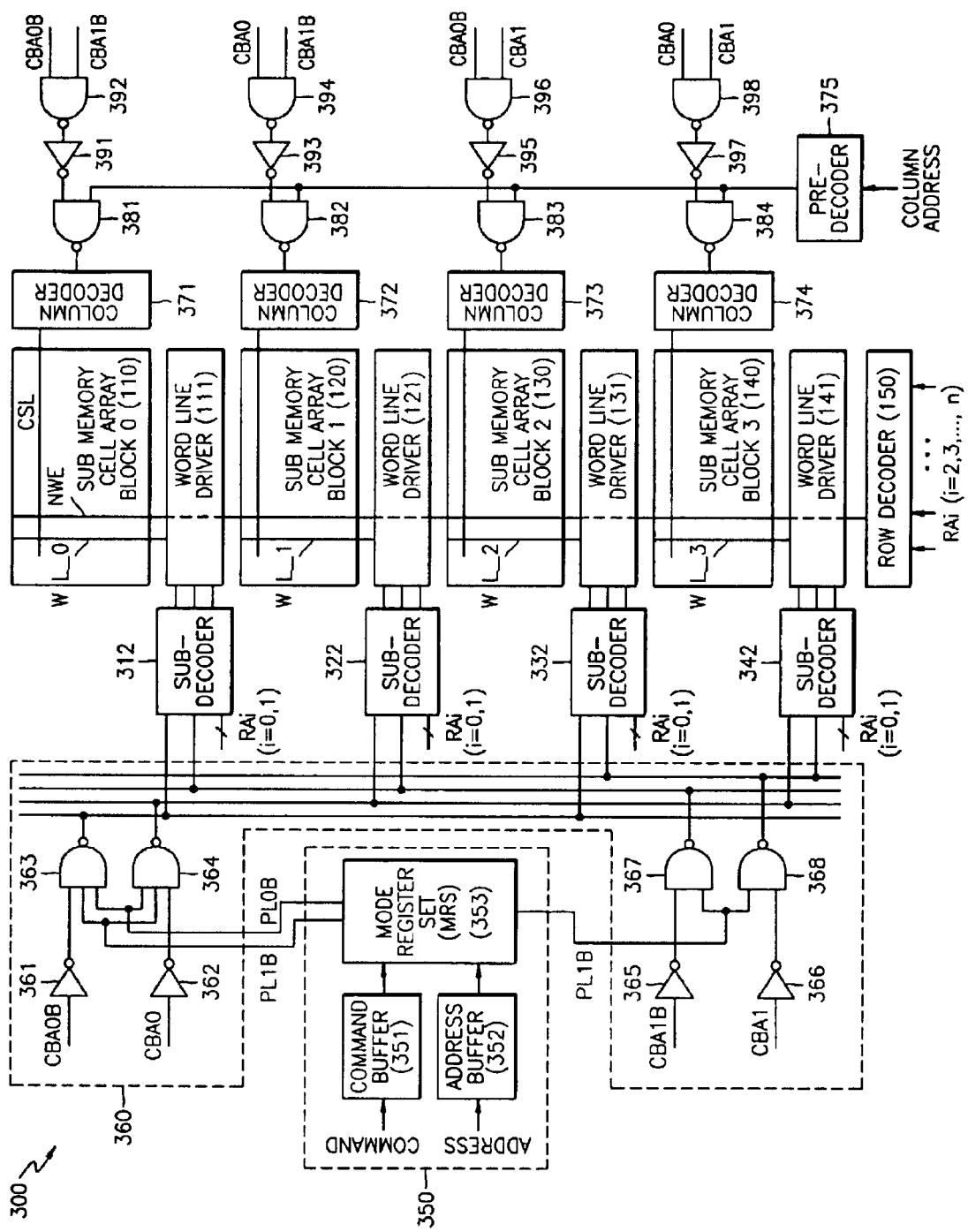
FIG. 3 is a circuit diagram of a memory cell array block according to an embodiment of the present invention, which enables a page length of a semiconductor memory device to be changed using control signals generated by a MRS (mode register set).

FIG. 3 is a circuit diagram of a memory cell array block according to an embodiment of the present invention, which enables the page length of a semiconductor memory device to be changed based on a specified operational mode. The circuit diagram of FIG. 3 illustrates one particular implementation of the general framework of FIG. 2. For instance, FIG. 3 illustrates an embodiment of the control circuit (250) of FIG. 2. In addition, in FIG. 3, a MRS (mode register set) is used for generating control signals that are input to the control circuit, wherein the control signals output from the MRS can be set and controlled by a user to change the page length as desired.

More specifically, referring to FIG. 3, a memory block (300) of a semiconductor memory device comprises a memory array that is logically divided into a plurality of sub-memory blocks (110, 120, 130, 140), wherein the sub-memory blocks are addressable using block addresses CBA0, CBA1. In the exemplary embodiment, 4 sub-memory blocks (blocks 0, 1, 2 and 3) are shown for illustrative purposes, although it is to be understood that the memory block (300) may comprise more or less sub-memory blocks.

The memory block (300) further comprises a plurality of word line drivers (111, 121, 131, 141), wherein each word line driver (111, 121, 131, 141) is associated with one of the plurality of sub-memory blocks (110, 120, 130, and 140), and a plurality of sub-decoders (312, 322, 332, 342), wherein each sub-decoder (312, 322, 332, 342) is associated with one of the wordline drivers (111, 121, 131, 141). Each corresponding subdecoder/word line driver pair comprises a wordline control circuit that is used for activating a wordline of an associated sub-memory block based on control signals output from a control circuit (360).

In general, the control circuit (360) selectively controls the wordline control circuits to selectively activate one or more corresponding wordlines (WL_0, WL_1, WL_2, WL_3) of the sub-memory blocks (110, 120, 130, 140) having the same row address (as decoded by row decoder (150)), to thereby change a page length of the semiconductor memory device. More specifically, the row decoder (150) receives and decodes a second input row address RAi (where, i=2, 3, . . . , n), and activates a normal word line enable signal (NWE) corresponding to the input row address, based on the decoding results. The control circuit (360) receives as input column block addresses CBA0 and CBA1, as well as control signals PL0B and PL1B that are generated by a control signal generator (350), and then outputs control signals to the sub-decoders (312, 322, 332, 342) based on the input block address and control signals. The sub-decoders (312, 322, 332, 342) receive as input the controls signals from the control circuit (360) and a first row address RAi (where, i=0 and 1), and then generate control signals that are output to the word line drivers (111, 121, 131, 141).

Based on the control signals from the sub-decoders (312, 322, 332, 342) and the NWE signal from the row decoder (150), the word line drivers (111, 121, 131, 141) will selectively activate one or more corresponding wordlines (WL_0, WL_1, WL_2, WL_3) of sub-memory blocks (110, 120, 130, 140), which have the same row address, to change the page length of the semiconductor memory device.

The control signal generator (350) comprises a command buffer (351), an address buffer (352), and a mode register set (MRS) (353). A memory controller (or CPU, for example) transmits a predetermined command signal and address signal to the control signal generator (350). The command buffer (351) receives the predetermined command signal and the address buffer (352) receives the external address signal from the memory controller. The MRS (353) receives the command and address signal from the command buffer (351) and address buffer (352), and then outputs control signals PL0B and PL1B based on the input command and address signals.

The control circuit (360) preferably comprises a plurality of inverters (361, 362, 365, 366) and a plurality of NAND circuits (363, 364, 367, 368). The inverter (361) receives as input a column block address complement CBA0B, and the inverter (362) receives as input a column block address CBA0. The NAND circuit (363) receives as input the output signal of inverter (361) and control signals PL0B and PL1B. The NAND circuit (364) receives as input an output signal of the inverter (362) and the control signals PL0B and PL1B. The inverter (365) receives as input a column block address complement CBA1B, and the inverter (366) receives as input a column block address CBA1. The NAND circuit (367) receives as input an output signal of the inverter (365) and the control signal PL1B. The NAND circuit (368) receives as input an output signal of the inverter (366) and the control signal PL1B.

The memory block (300) further comprises a pre-decoder (375), a plurality of column decoders (371, 372, 373, 374) and a plurality of logic circuits (381, 382, 383, 384, 391, 392, 393, 394, 395, 396, 397, 398), the functions of which will be explained below. The pre-decoder (375) receives and pre-decodes a column address, excluding the addresses used for the column block address. For example, in the exemplary embodiment of FIG. 3, assuming the total number of addresses is n, then n−2 column addresses are input to the pre-decoder (375) because two addresses are used for the CBA.

The logic circuit (392) receives as input column block addresses CBA0B and CBA1B. The logic circuit (394) receives as input column block addresses CBA0 and CBA1B. The logic circuit (396) receives as input column block addresses CBA0B and CBA1. The logic circuit (398) receives as input column block addresses CBA0 and CBA1. The output of the logic circuits 392, 394, 396 and 398 are inverted by inverters 391, 393, 395 and 397, respectively.

The logic circuit (381) receives as input an output signal of the inverter (391) and an output signal of the pre-decoder (375) and outputs a signal to the column decoder (371) associated with the first sub-memory block (110). The logic circuit (382) receives as input the output of the inverter (393) and an output signal of the pre-decoder (375), and outputs a signal to the column decoder (372) associated with the second sub-memory block (120). The logic circuit (383) receives as input an output of the inverter (395) and an output signal of the pre-decoder (375), and outputs a signal to the column decoder (373) associated with the third sub-memory block (130). The logic circuit (384) receives as input an output of the inverter (397) and an output signal of the pre-decoder (375), and outputs a signal to the column decoder (374) associated with the fourth sub-memory block (140).

In the exemplary embodiment of FIG. 3, as noted above, the control signals, which are generated using the MRS (353) in the control signal generator (350), can be varied to adjust the page length as desired. The MRS (353) outputs the control signals that are processed by the control circuit (360) to perform an operational mode as specified by the external command and address received by the control signal generator (350) from a memory controller or CPU, for example.

Figures 4C, 5:
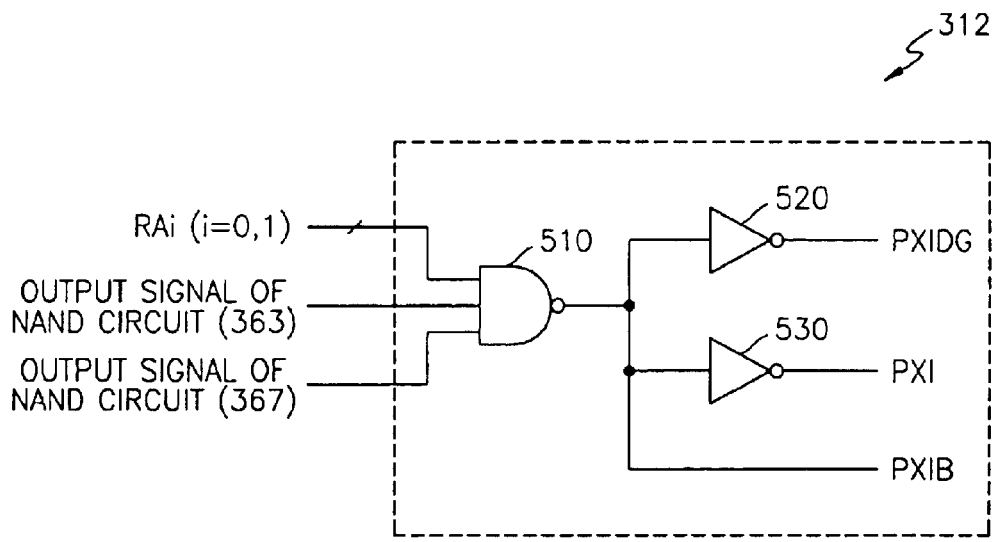

By way of example, FIGS. 4A–4C illustrate various operational modes in which the page length of the semiconductor memory device of FIG. 3 is varied based on the control signals PL0B and PL1B. In particular, FIG. 4A is a table that illustrates an operational mode in which both control signals PL0B and PL1B are deactivated/disabled (e.g., logic level high) to obtain a page length of $2^{n-2}$, wherein only one of the sub-memory blocks are activated depending on the logic levels of the column block addresses CBA0 and CBA1 as shown. Further, FIG. 4B is a table that illustrates an operational mode in which only control signal PL0B is activated/enabled (e.g., logic level low) to obtain a page length of $2^{n-1}$, wherein either sub-memory blocks 0 and 1 are both activated when column block address CBA1 is logic low or where sub-memory blocks 2 and 3 are both activated when CBA1 is logic high (in this mode, CBA0 is don't care). Moreover, FIG. 4C is a table that illustrates an operational mode in which only control signal PL1B is activated/enabled (e.g., logic level low) to obtain a page length of $2^n$, wherein all sub-memory blocks (0, 1, 2 and 3) are activated regardless of the logic levels of the column block addresses CBA0 and CBA1.

Various operational modes of a semiconductor memory device according to the present invention will be described in further detail with reference to the exemplary embodiments of FIG. 3 and FIGS. 4A, 4B and 4C. Referring to FIG. 3, the control signal generator (350) receives an external command and address and generates predetermined control signals PL0B and PL1B in response to the command and the address using MRS (353). The control circuit (360) receives the column block addresses CBA0 and CBA1 and the control signals PL0B and PL1B, and then outputs control signals to the sub-decoders (312, 322, 332, 342). The sub-decoders (312, 322, 332, 342) selectively activate corresponding word line drivers (111, 121, 131, 141) based on the control signals from the control circuit (360) and a first row address RAi (where i=0, 1). An activated sub-decoder outputs a word line power supply signal (PXI) to a corresponding wordline driver to enable a corresponding wordline (WL_), WL_1, WL_2, WL_3) of the selected sub-memory block, when the normal word line enable signal NWE is generated from row decoder (150). In other words, the word line drivers (111, 121, 131, 141) switch the output signal of the corresponding sub-decoders (312, 322, 332, 342) to a wordline to be activated, in response to the normal word line enable signal NWE generated by the row decoder (350), thereby activating a wordline of the associated sub-memory block. Exemplary embodiments of a subdecoder and wordline driver according to the invention, which may be implemented in the device of FIG. 3, for example, are described below in further detail with reference to FIGS. 5 and 6.

One mode of operation of the semiconductor memory device having the exemplary architecture of FIG. 3 enables selective activation of one of the sub-memory blocks (110, 120, 130, and 140) to obtain a page length of $2^{n-2}$. In particular, when the control signals PL0B and PL1B are deactivated (e.g., logic "high" state), only one of the sub-memory blocks (110, 120, 130, and 140) will be activated based on the logic states of the column block addresses CBA0 and CBA1, as shown in FIG. 4A. Furthermore, in this mode of operation, one of the column decoders (371, 372, 373, 374) is activated based on the logic state of the column block addresses CBA0 and CBA1.

By way of example, assume that the control signals PL0B and PL1B are both deactivated (e.g., in a logic high state) and that the column block addresses CBA0 and CBA1 are in a logic "low" state. In this case, the output of each NAND gate (363) and (367) will be logic "high", which causes sub-decoder (312) to be activated (assuming, of course, the required address signal RAi is input to sub-decoder (312)). The sub-decoder (312) will then generate the appropriate control signals to cause the wordline driver (111) to activate a wordline (WL_0) of sub-memory block (110). Furthermore, because the column block addresses CBA0 and CBA1 are in a logic "low" state, only the logic circuits (392), (391), and (381) will operate, and thus activate the column decoder (371). The column decoder (371) receives column address information of the pre-decoder (375) and then selects a column select line (CSL) among $2^{n-2}$ column select lines (CSLs) on the sub-memory block (110). That is, the semiconductor memory device corresponding to the activated sub-memory block (110) has a page length of $2^{n-2}$. For example, in a page mode operation, the wordline (row) is maintained active, while the n−2 column addresses are sequentially applied to access the memory cells of the activated row.

Another mode of operation of the semiconductor memory device having the exemplary architecture of FIG. 3 enables selective activation of two sub-memory blocks to obtain a page length of $2^{n-1}$. In particular, if the control signal PL0B is activated (e.g., logic "low" state) and the control signal PL1B is deactivated (e.g., logic "high" state), two sub-memory blocks will be activated based on the logic state of the column block addresses CBA1B and CBA1, regardless of a logic state of the column block addresses CBA0 and CBA0B, as shown in FIG. 4B. More specifically, if the column block address CBA1 has a logic "low" state, then wordlines (WL_0 and WL_1) of the sub-memory blocks (110) and (120) are activated regardless of the logic state of the column block address CBA0. Moreover, if the column block address CBA1 has a logic "high" state, then wordlines (WL_2 and WL_3) of the sub-memory blocks (130) and (140) are activated regardless of the logic state of the column block address CBA0. Furthermore, in this mode of operation, the column decoders associated with the activated sub-memory blocks can be selectively activated based on the logic state of the of the column block address CBA0.

By way of example, assume that the control signal PL0B is activated (e.g., logic "low" state) and the control signal PL1B is deactivated (e.g., logic "high" state). In this case, since a control signal PL1B with a "high" logic level is input to both NAND circuits (363) and (364) of the control circuit (360), the output of each NAND circuit will be a logic "high" state regardless of the logic state of the column block addresses CBA0B and CBA0. Assuming further that the column block address CBA1 has a logic "low" state, the output of the NAND circuit (367) will be in a logic "high" state. In this case, since the outputs of each NAND circuit (363), (364) and (367) is logic "high", sub-decoders (312) and (322) will be activated (assuming, of course, the required address signal RAi is input to such sub-decoders). The sub-decoders (312) and (322) will then generate the appropriate control signals to cause the corresponding wordline drivers (111) and (121) to activate respective wordlines (WL_0) and (WL_1) of sub-memory blocks (110) and (120).

Furthermore, when the column block address CBA1 is in a logic "low" state and the sub-memory blocks (110) and (120) are activated, the column decoders (371) or (372) should be separately activated to obtain a page length of $2^{n-1}$. In a preferred embodiment, a column select line (CSL) can be activated on one of the sub-memory blocks (110) or (120) based on the logic state of the column block address CBA0. For example, in FIG. 3, if the column block address CBA0 is in a "logic" low state, the inputs to the NAND circuit (392) will both be logic "high" and, thus, the column select line (CSL) generated from the column decoder (371) is activated on the sub memory cell array block (110), and the column lines of the sub-memory block (110) can be selected in response to the column select line (CSL). Then, by changing the column block address CBA0 to logic "high", the column decoder (371) for the sub-memory block (110) will be deactivated and, since all inputs of the NAND circuit (394) will be logic "high", the column decoder (372) for the sub-memory block (120) will be activated.

Therefore, for the exemplary mode of operation depicted in FIG. 4B, a page length with respect to an activated word line is $2^{n-1}$, which is twice the page length obtained with the operational mode of FIG. 4A. That is, if a user requires a semiconductor memory device having a page length of $2^{n-1}$, an activated control signal PL0B is generated by the control signal generator (350) and input to the control circuit (360), to thereby change the page length of the semiconductor memory device.

Another mode of operation of the semiconductor memory device having the exemplary architecture of FIG. 3 enables selective activation of four sub-memory blocks to obtain a page length of $2^n$. In particular, if the control signal PL1B is activated (e.g., logic "low" state), all of the sub-memory blocks (110, 120, 130 and 140) will be activated, regardless of the logic state of the column block addresses CBA0B, CBA0, CBA1B, and CBA1, as shown in FIG. 4C. More specifically, if the control signal PL1B is logic "low", the output of each NAND circuit (363, 364, 367, and 368) of the control circuit (360) will be logic "high", regardless of the logic state of the column block addresses CBA0B, CBA0, CBA1B, and CBA1. In this mode of operation, the wordlines (WL_0, WL_1, WL_2 and WL_3) of the sub-memory blocks (110), (120), (130) and (140) will be activated regardless of the logic state of the column block addresses CBA0 and CBA1.

Furthermore, in this mode of operation, the column decoders associated with the activated sub-memory blocks can be selectively activated based on the logic states of the of the column block addresses CBA0 and CBA1. Thus, whether a given column select line (CSL) of a sub-memory block is activated is determined by the logic combination of the column block addresses CBA0 and CBA1. Thus, in this case, the semiconductor memory device has a page length of $2^n$.

Advantageously, in the exemplary embodiment of FIG. 3, since the control signal generator (350) is implemented with the mode register set (353), the mode register set (353) can output control signals to controllably vary the page length of the semiconductor device based on an address and a command.

Figure 6:
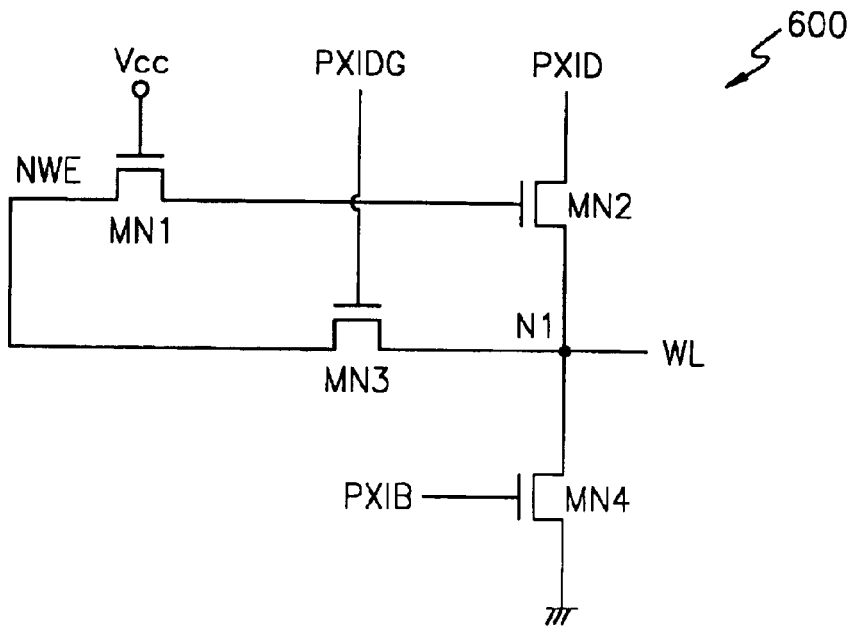
FIG. 6 is a circuit diagram of a word line driver according to an embodiment of the invention, which can be implemented in the circuit of FIG. 3.

Exemplary embodiments of the sub-decoders and wordline drivers shown in FIG. 3 will now be discussed with reference to FIGS. 5 and 6. FIG. 5 is a circuit diagram illustrating a sub-decoder according to an embodiment of the present invention. For purposes of illustration and explanation, FIG. 5 depicts an embodiment of the sub-decoder (312) of FIG. 3. FIG. 6 is a circuit diagram illustrating a portion of driver circuitry of a wordline driver according to an embodiment of the invention.

Referring to FIG. 5, the sub-decoder (312) comprises a NAND circuit (510), first and second inverters (520 and 530). The NAND circuit (510) receives a first row address RAi (where i=0, 1) and control signals output from the NAND circuits (363) and (367) of the control circuit (360). The first inverter (520) receives the output signal of the NAND circuit (510) and generates a first gating signal PXIDG. The second inverter (530) receives the output signal of the NAND circuit (510) and generates a word line power supply signal PXI at a boosting level. The sub-decoder (312) also outputs a second gating signal PXIB (which is the output of the NAND circuit (510)).

Referring to FIG. 6, a wordline driver (600) comprises a plurality of MOS transistors (MN1, MN2, MN3, MN4). A power supply voltage VCC is supplied to a gate of the MOS transistor (MN1). A first terminal of the MOS transistor (MN1) is coupled to a normal word line enable signal (NWE) line (as noted above, NWE is generated by the row decoder (150)). A second terminal of the MOS transistor (MN1) is connected to a gate terminal of the MOS transistor (MN2). A first terminal of the MOS transistor (MN2) is connected to a word line power supply signal PXI (output from the sub-decoder (312), for example). A second terminal of the MOS transistor (MN2) is connected to a word line (WL). A gate of the MOS transistor (MN3) is connected to a first gating signal PXIDG (output from decoder (312), for example). A gate of the MOS transistor (MN4) is connected to a second gating signal PXIB (output from the sub-decoder (312), for example). The number of wordline driver circuits (600) implemented in a given wordline driver (111, 121, 131, 141) of FIG. 3 is equal to the number of word lines provided on the corresponding sub-memory block.

The sub-decoder (312) and the word line driver (600) (of wordline driver (111) activate the word line (WL_0) in response to a first row address RAi (where, i=0 and 1) and the output signal of the control circuit (360). More specifically, the sub-decoder (312) and the word line driver (600) operate as follows. The sub-decoder (312) generates the first gating signal PXIDG, the second gating signal PXIB, and the word line power supply signal PXI, based on the input control signals and row address. In particular, the first gating signal PXIDG and the word line power supply signal PXI are in a logic "high" state only if the first input row address RAi (where, i=0, 1) and the output signals of the NAND circuits (363) and (367) of FIG. 3 are in a logic "high" state. In such case, the second gating signal PXIB for pre-charging the word line (WL) is in a logic low state.

In the word line driver (600) of FIG. 6, the power supply voltage VCC is applied to the gate of the MOS transistor MN1, and thus the MOS transistor (MN1) is always turned on. When the first gating signal PXIDG and the word line power supply signal PXI are in a logic "high" state and the second gating signal PXIB is in a logic "low" state, the MOS transistor (MN3) is turned on, and the MOS transistor (MN4) is turned off. Thus, in this case, the word line power supply signal PXI and the word line WL are connected to each other, and the word line WL is activated.

On the other hand, if the first gating signal PXIDG and the word line power supply signal PXI are in a logic "low" state and the second gating signal PXIB is in a logic "high" state, the MOS transistor (MN3) is turned off, and the MOS transistor (MN4) is turned on. Thus, in this case, the word line (WL) is deactivated.

In the exemplary embodiment of FIG. 3 described above, the control signal generator (350) is implemented with a MRS (353) of the semiconductor memory device to generate control signals for varying the page length. It is to be appreciated that other methods and devices for generating the control signal may be implemented in accordance with the present invention. For instance, FIG. 7 illustrates a control signal generator circuit (700) according to another embodiment of the invention which is implemented using wire bonding and FIG. 8 illustrates a control signal generator according to yet another embodiment of the invention which is implemented using fuses.

Figure 7:
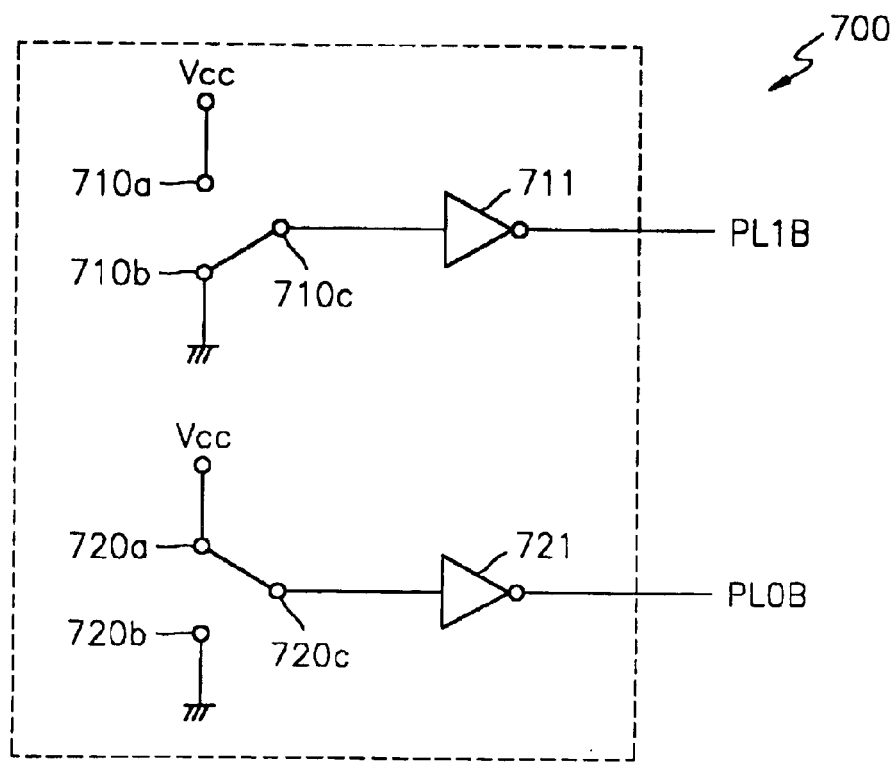
FIG. 7 illustrates a control signal generator according to an embodiment of the present invention.

More specifically, the control signal generator 700 shown in FIG. 7 includes a plurality of bonding pads (710a, 710b, 710c, 720a, 720b, 720c) and inverters (711, 721). The bonding pads (710a) and (720a) are connected to a power supply voltage VCC, and the bonding pads (710b) and (720b) are connected to ground. An input terminal of the inverter (711) is connected to the bonding pad (710c), and an input terminal of the inverter (721) is connected to the bonding pad (720c). The inverters (721) and (711) output respective control signals PL0B and PL1B.

The process of connecting bonding pad (710c) to pad (710a) or pad (710b), and connecting bonding pad (720c) to pad (720a) or (720b) is performed during manufacturing of the semiconductor memory device. The logic state of the first control signal PL0B and the second control signal PL1B will depend on the connection of the bonding pads. For example, as depicted in FIG. 7, with bonding pad (710c) connected to bonding pad (710b), and bonding pad (720c) connected to bonding pad (720a), the control signal PL1B is set to a logic "high" state, and the control signal PL0B is set to a logic "low" state. Thus, if the control signal generator circuit (700) of FIG. 7 is implemented in the exemplary embodiment of FIG. 3, the page length of the semiconductor memory device would be $2^{n-1}$ (see FIG. 4B). Of course, the connections between the respective bonding pads can be varied to generate control signals of different logic states to obtain a desired page length. It is to be understood that the connections between bonding pads and power pins (VCC, VSS) may be implemented with metal or wire bonding.

Figure 8:
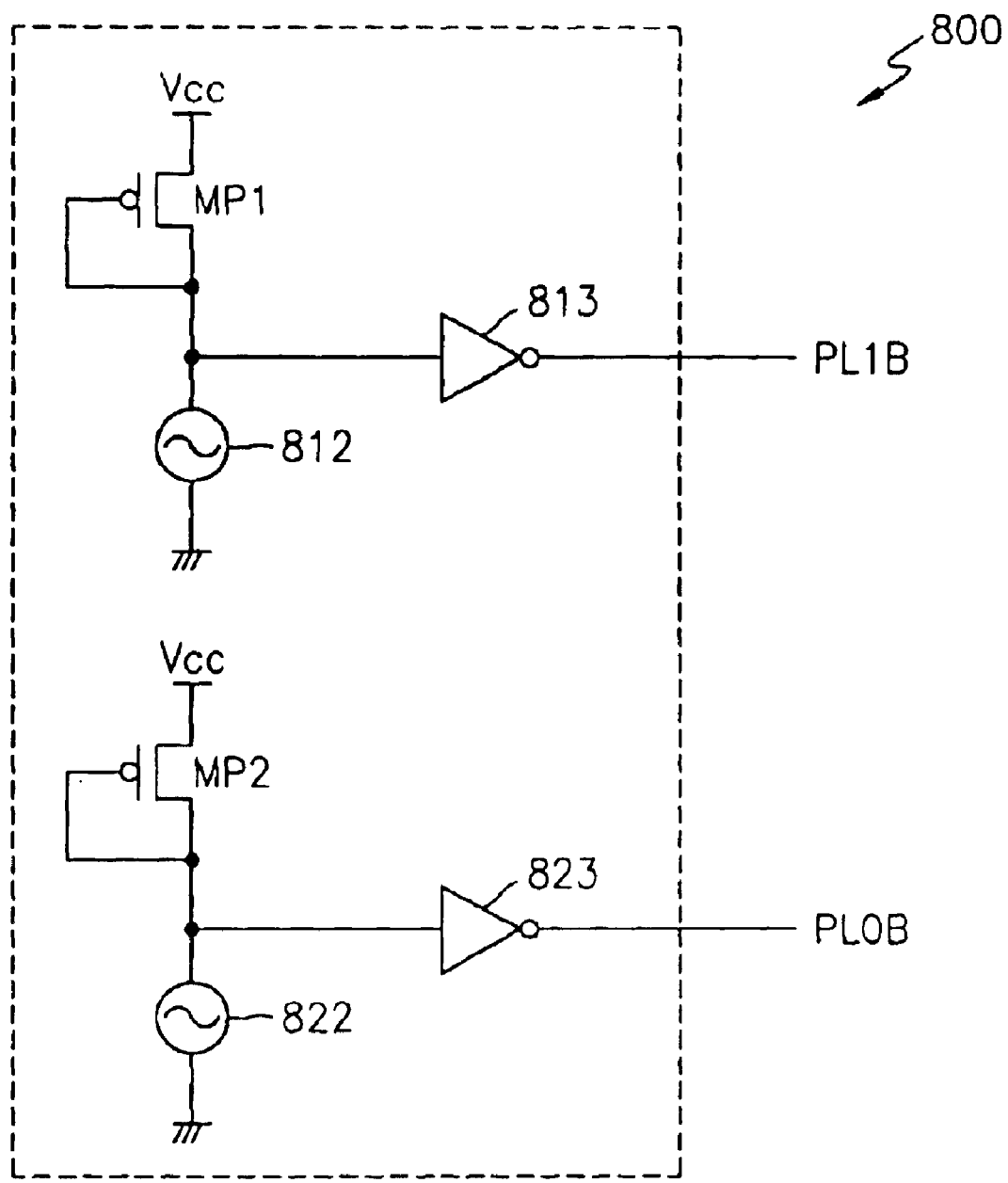
FIG. 8 illustrates a control signal generator according to another embodiment of the present invention.

Referring to FIG. 8, a control signal generator (800) according to another embodiment of the invention comprises diode-coupled MOS transistors (MP1) and (MP2), laser fuses (812) and (822), and inverters (813) and (823). The MOS transistor (MP1) has a diode-coupled connection in which the gate and drain of the MOS transistor (MP1) are connected to each other, and the source is connected to a power supply voltage VCC. The laser fuse (812) is connected between the drain of the MOS transistor (MP1) and a ground voltage. The inverter (813) inverts a signal of a drain terminal of the MOS transistor (MP1) and outputs control signal PL1B.

Likewise, the MOS transistor (MP2) has a diode-coupled connection in which the gate and drain of the MOS transistor (MP2) are connected to each other, and the source is connected to the power supply voltage VCC. The laser fuse (822) is connected between the drain of the MOS transistor (MP2) and the ground voltage. The inverter (823) inverts a signal of a drain terminal of the MOS transistor (MP2) and outputs control signal PL0B.

The logic state of the control signals PL0B and PL1B depends on the state of a laser fuse. More specifically, if the laser fuse (812) or (822) is disconnected, the corresponding control signal will have a logic low state, and if the laser fuse (812) or (822) is not disconnected, the corresponding control signal will have a logic "high" state. For example, assuming the laser fuse (812) is connected and the laser fuse (822) is disconnected, the control signal PL0B is in a logic "low" state, and the control signal PL1B is in a logic "high" state. In such case, if the control signal generator circuit (800) is implemented in the exemplary embodiment of FIG. 3, the page length of the semiconductor memory device would be $2^{n-1}$ (see FIG. 4B). Of course, the control signal generator (800) may be adapted to generate control signals having different logic states based on the state of the laser fuses (812) and (822).

Figure 9:
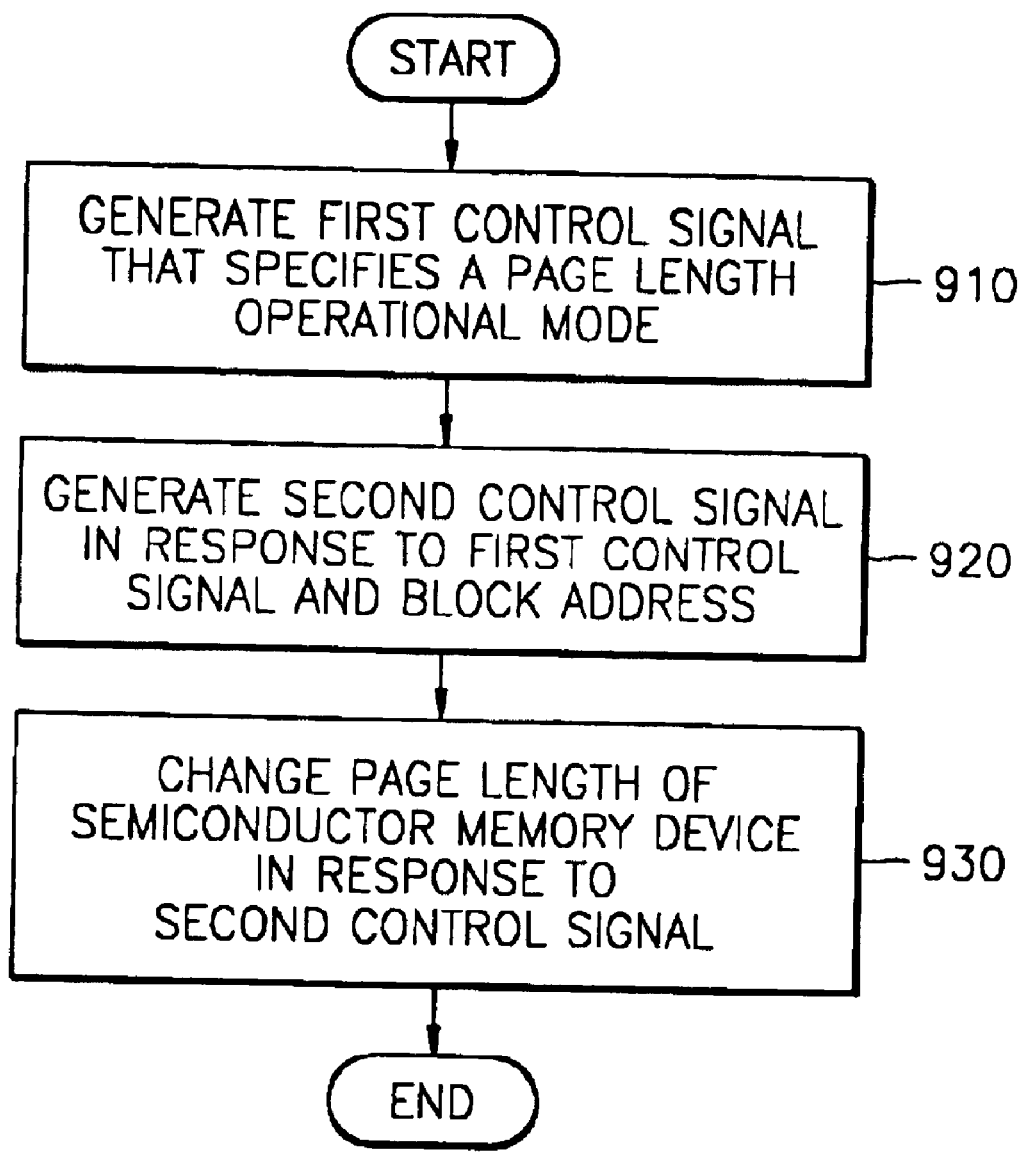
FIG. 9 is a high-level flow diagram illustrating a method for changing a page length of the semiconductor memory device according to an embodiment of the present invention.

FIG. 9 is a high-level flow diagram illustrating a method for changing a page length of a semiconductor memory device according to an embodiment of the present invention. In general, a method for changing a page length of a semiconductor memory device comprises generating a first control signal that specifies one of a plurality of page length operational modes (step 910), generating a second control signal based on the first control signal and a block address (step 920) and then using the second control signal to change the page length of the semiconductor device according to the specified page length operational mode (step 930).

In one embodiment of the invention, the step of generating a first control signal (step 910) comprises generating the first control signal based on an external command and address received by, e.g., a memory controller or CPU. For instance, step 910 may be implemented by the control signal generator (350) shown in FIG. 3 using a MRS (353). In other embodiments of the invention, the first control signal may be generated using devices or methods such as the control signal generator circuits and methods described above with reference to FIG. 7 or 8, for example.

Furthermore, the step of generating a second control signal (step 920) may be implemented such as discussed above with reference to FIG. 3, whereby a control circuit processes a control signal from the control signal generator and a column block address to generate a second control signal that selectively controls respective wordline control circuits of memory blocks. Further, the step of adjusting the page length (step 930) in response to the second control signal preferably comprises selectively activating one or more corresponding wordlines of the memory blocks, which have a same row address, in response to the second control signal to thereby change the page length of the semiconductor memory device.

Figure 10:
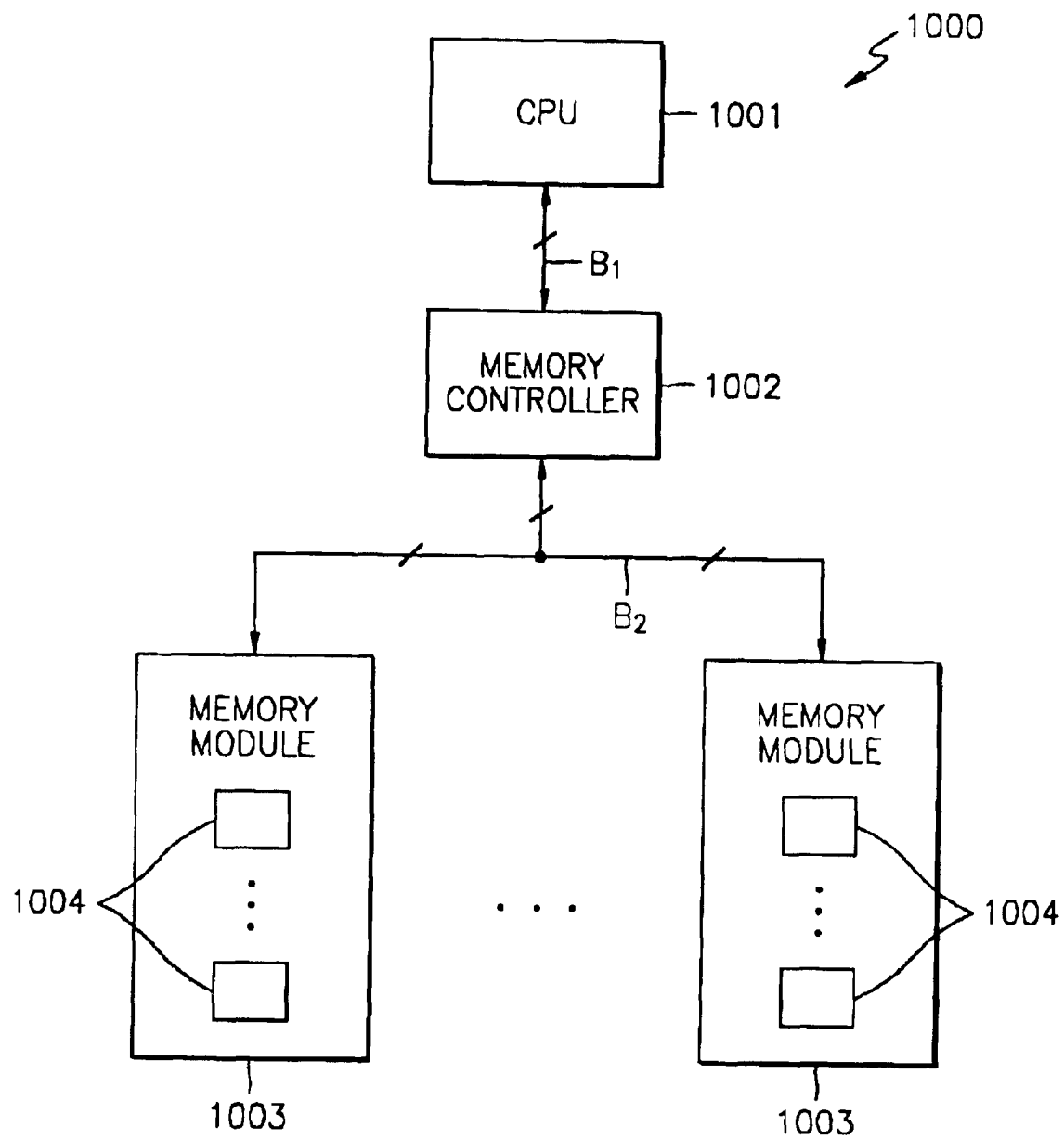
FIG. 10 is a schematic block diagram illustrating a memory system in which the present invention may be implemented.

FIG. 10 is a schematic block diagram illustrating a memory system in which the present invention may be implemented. The memory system (1000) comprises a CPU (1001), memory controller (1002) and a plurality of memory modules (1003). Each memory module (1003) comprises a plurality of semiconductor memory devices (1004) in which the present invention is implemented. The CPU (1001) may be a microprocessor unit (MPU) or a network processing unit (NPU), etc. The CPU (1001) is connected to the memory controller by a first bus system (B1) (e.g., control bus, data bus, address bus) and the memory controller (1002) is connected the memory modules (1003) via a second bus system (B2) (control bus, data bus, address bus). In the exemplary framework of FIG. 10, the CPU (1001) controls the memory controller (1002) and the memory controller (1002) controls the memory (1004) (although it is to be understood that the CPU can be implemented to directly control the memory, without the use of a separate memory controller).

In the exemplary embodiment of FIG. 10, each memory module (1003) can represent, for example, a memory bank, and each memory device (1004) of a given memory module (1003) may represent a memory device in which the present invention is implemented. In such case, each memory device (1004) can be logically divided into a plurality of sub-memory blocks, and controlled as described above to change the page length. The control circuitry for performing memory accesses and/or changing the page length can be located within the memory devices (1004).

In one preferred embodiment, the memory devices of one memory module may have an ×8 bit organization, while the memory devices of another memory module may have an ×16 bit organization. That is, different memory modules may be operated with different bit organizations.

In another embodiment of the invention, a memory system may comprise one or more separate semiconductor memory devices (instead of the memory modules having a plurality of memory devices as shown in FIG. 10), and a central processing unit (and no memory controller). In this embodiment, the memory devices communicate directly with the central processing unit. In addition, one semiconductor memory device may have an ×8 bit organization, while another semiconductor memory device may have an ×16 bit organization. That is, two memory devices may have different bit organizations.

In yet another embodiment, a memory system according to the invention may comprise one or more separate semiconductor memory devices (instead of the memory modules having a plurality of memory devices as shown in FIG. 10) that directly communicate with a memory controller (no CPU). In this embodiment, one memory device may have an ×8 bit organization, and another memory device may have an ×16 bit organization.

Although illustrative embodiments have been described herein with reference to the accompanying drawings, it is to be understood that the invention is not limited to the precise system and method embodiments described herein, and that various other changes and modifications may be affected therein by one skilled in the art without departing form the scope or spirit of the invention. All such changes and modifications are intended to be included within the scope of the invention as defined by the appended claims.

What is claimed is:

1. A semiconductor memory device, comprising:
   a memory cell array that is logically divided into a plurality of memory blocks, wherein each memory block is addressable by a corresponding block address;
   a plurality of wordline control circuits, wherein each wordline control circuit is associated with one of the memory blocks for activating a wordline of the associated memory block; and
   a control circuit for selectively controlling the wordline control circuits to activate one or more corresponding wordlines having a same row address to change a page length of the semiconductor memory device.

2. The device of claim 1, wherein the control circuit receives as input a column block address and a first control signal, and then generates a second control signal to selectively activate one or more of the wordline control circuits.

3. The device of claim 2, further comprising a control signal generator which receives an external command and an external address, and then generates the first control signal based on the external command and the external address.

4. The device of claim 3, wherein the control signal generator comprises:
   an address buffer for receiving the external address and generating an internal address;
   a command buffer for receiving the external command and generating an internal command; and
   a mode register set for generating the first control signal based on the internal address and the internal command.

5. The device of claim 2, wherein each wordline control circuit comprises a sub-decoder circuit and an associated wordline driver circuit.

6. The device of claim 5, wherein each sub-decoder circuit receives a row address and the second control signal output from the control circuit to selectively activate the associated wordline driver circuit.

7. The device of claim 2, further comprising a control signal generator for generating the first control signal, wherein the control signal generator is configured to generate the first control signal through one of wire bonding, metal option, and fuse option.

8. The device of claim 2, wherein when the first control signal is deactivated, one wordline is enabled at one memory block of the plurality of memory blocks, and wherein when the first control signal is activated, at least two wordlines that have the same row address are enabled at two memory blocks of the plurality of memory blocks.

9. The device of claim 1, wherein the block address comprises a row address or a column address.

10. A memory system, comprising:
    a memory controller for generating a plurality of command and address signals; and a first memory module that receives the command and address signals, the first memory module comprising a plurality of memory devices including a first memory device, wherein the first memory device comprises:
- a memory cell array that is logically divided into a plurality of memory blocks, wherein each memory block is addressable by a corresponding block address;
- a plurality of wordline control circuits, wherein each wordline control circuit is associated with one of the memory blocks for activating a wordline of the associated memory block; and
- a control circuit for selectively controlling the wordline control circuits to activate one or more corresponding wordlines having a same row address to change a page length of the first memory device.

11. The memory system of claim 10, further comprising a second memory module that receives the command and address signals generated by the memory controller, the second memory module comprising a plurality of memory devices including a second memory device, wherein the second memory device comprises a memory cell array that is logically divided into a plurality of memory blocks;
wherein the first memory device has a first bit organization and the second memory device has a second bit organization, wherein the first bit organization and the second bit organization are different.

12. The memory system of claim 10, wherein the control circuit receives as input a column block address and a first control signal, and then generates a second control signal to selectively activate one or more of the wordline control circuits.

13. The memory system of claim 12, further comprising a control signal generator, wherein the control signal generator comprises:
- an address buffer for receiving an address signal generated from the memory controller and generating an internal address;
- a command buffer for receiving a command generated from the memory controller and generating an internal command; and
- a mode register set for generating the first control signal based on the internal address and the internal command.

14. The memory system of claim 13, wherein when the first control signal is deactivated, one wordline is enabled at one memory block of the plurality of memory blocks, and wherein when the first control signal is activated, at least two wordlines that have the same row address are enabled at two memory blocks of the plurality of memory blocks.

15. A memory system, comprising:
- a central processing unit for generating a plurality of command and address signals; and
- a first memory module that receives the command and address signals, the first memory module comprising a plurality of memory devices including a first memory device, wherein the first memory device comprises:
  - a memory cell array that is logically divided into a plurality of memory blocks, wherein each memory block is addressable by a corresponding block address;
  - a plurality of wordline control circuits, wherein each wordline control circuit is associated with one of the memory blocks for activating a wordline of the associated memory block; and
  - a control circuit for selectively controlling the wordline control circuits to activate one or more corresponding wordlines having a same row address to change a page length of the first memory device.

16. The memory system of claim 15, further comprising a second memory module that receives the command and address signals generated by the central processing unit, the second memory module comprising a plurality of memory devices including a second memory device, the second memory device comprising a memory cell array that is logically divided into a plurality of memory blocks;
wherein the first memory device has a first bit organization and the second memory device has a second bit organization, wherein the first bit organization and the second bit organization are different.

17. The memory system of claim 15, wherein the first memory device further comprises a control signal generator, wherein the control signal generator comprises:
- an address buffer for receiving an address signal generated from the central processing unit and generating an internal address;
- a command buffer for receiving a command generated from the central processing unit and generating an internal command; and
- a mode register set for generating a first control signal based on the internal address and the internal command.

18. The memory system of claim 17, wherein when the first control signal is deactivated, one wordline is enabled at one memory block of the plurality of memory blocks, and wherein when the first control signal is activated, at least two wordlines that have the same row address are enabled at two memory blocks of the plurality of memory blocks.

19. The memory system of claim 15, wherein the central processing unit is a network processing unit (NPU).

20. A memory system, comprising:
- a memory controller for generating a plurality of command and address signals; and
- a first memory device that receives the command and address signals, the first memory device comprising:
  - a memory cell array that is logically divided into a plurality of memory blocks, wherein each memory block is addressable by a corresponding block address;
  - a plurality of wordline control circuits, wherein each wordline control circuit is associated with one of the memory blocks for activating a wordline of the associated memory block; and
  - a control circuit for selectively controlling the wordline control circuits to activate one or more corresponding wordlines having a same row address to change a page length of the first memory device.

21. The memory system of claim 20, further comprising a second memory device that receives the command and address signals generated by the memory controller, the second memory device comprising a memory cell array that is logically divided into a plurality of memory blocks;
wherein the first memory device has a first bit organization and the second memory device has a second bit organization, wherein the first bit organization and the second bit organization are different.

22. A memory system, comprising:
- a central processing unit for generating a plurality of command and address signals; and
- a first memory device that receives the command and address signals, the first memory device comprising:
  - a memory cell array that is logically divided into a plurality of memory blocks, wherein each memory block is addressable by a corresponding block address;

a plurality of wordline control circuits, wherein each wordline control circuit is associated with one of the memory blocks for activating a wordline of the associated memory block; and a control circuit for selectively controlling the wordline control circuits to activate one or more corresponding wordlines having a same row address to change a page length of the first memory device.

23. The memory system of claim 22, further comprising a second memory device that receives the command and address signals generated by the central processing unit, wherein the second memory device comprises a memory cell array that is logically divided into a plurality of memory blocks;

wherein the first memory device has a first bit organization and the second memory device has a second bit organization, wherein the first bit organization and the second bit organization are different.

24. The memory system of claim 22, wherein the central processing unit is a network processing unit (NPU).

25. The memory system of claim 22, wherein the central processing unit is a microprocessor unit (MPU).

26. A method for changing a page length of a semiconductor memory device comprising a memory cell array that is logically divided into a plurality of memory blocks, wherein each memory block is addressable by a corresponding block address, the method comprising the steps of:

generating a first control signal specifying one of a plurality of page length operational modes;

generating a second control signal based on the first control signal and a block address; and selectively activating one or more wordlines in the memory blocks having a same row address to provide a page length of the semiconductor memory device corresponding to the specified page length operational mode, in response to the second control signal.

27. The method of claim 26, wherein the step of generating the first control signal comprises the steps of:

receiving a command signal and an address signal; and generating the first control signal based on the command signal and the address signal.

28. The method of claim 27, wherein the first control signal is generated by a mode register set.

29. The method of claim 26, wherein the step of activating one or more wordlines in the memory blocks comprises the steps of:

inputting the second control signal and a row address into a plurality of subdecoders; and activating one or more wordline drivers associated with the memory blocks based on wordline power supply signals generated by the subdecoders.

* * * * *